United States Patent
Hui et al.

(10) Patent No.: US 9,496,436 B2
(45) Date of Patent: Nov. 15, 2016

(54) FOLDABLE SOLAR POWER RECEIVER

(71) Applicant: Monarch Power Corp, Scottsdale, AZ (US)

(72) Inventors: Joseph Y. Hui, Fountain Hills, AZ (US); Joseph W. Bostaph, Chandler, AZ (US); Richard Howe, Mesa, AZ (US)

(73) Assignee: Monarch Power Corp., Scottsdale, AZ (US)

( * ) Notice: Subject to any disclaimer, the term of this patent is extended or adjusted under 35 U.S.C. 154(b) by 29 days.

(21) Appl. No.: 13/743,001

(22) Filed: Jan. 16, 2013

(65) Prior Publication Data

US 2013/0327371 A1   Dec. 12, 2013

Related U.S. Application Data

(63) Continuation-in-part of application No. 13/491,110, filed on Jun. 7, 2012.

(51) Int. Cl.
*H01L 31/04* (2014.01)
*H02S 30/20* (2014.01)
*G02B 5/10* (2006.01)
*H01L 31/054* (2014.01)
*H01Q 15/16* (2006.01)

(52) U.S. Cl.
CPC ............. *H01L 31/045* (2013.01); *G02B 5/10* (2013.01); *H01L 31/0547* (2014.12); *H02S 30/20* (2014.12); *Y02B 10/70* (2013.01); *Y02E 10/52* (2013.01)

(58) Field of Classification Search
CPC ............ H01L 31/045; H01L 31/0481; H01Q 15/162; A45B 2200/1027
See application file for complete search history.

(56) References Cited

U.S. PATENT DOCUMENTS

| | | | |
|---|---|---|---|
| 4,292,957 A | | 10/1981 | Golder |
| 4,293,731 A | * | 10/1981 | Schweig et al. .............. 136/245 |
| 4,947,825 A | | 8/1990 | Moriarty |
| 5,451,975 A | * | 9/1995 | Miller et al. .................. 343/915 |
| 6,330,886 B1 | * | 12/2001 | Culver ......................... 135/15.1 |
| 7,878,192 B2 | | 2/2011 | Larsen |

(Continued)

FOREIGN PATENT DOCUMENTS

JP   2010025864   3/2010

OTHER PUBLICATIONS

Enchanted Learning (http://www.enchantedlearning.com/subjects/plants/printouts/floweranatomy.shtml[Nov. 20, 2014 3:40:19 PM]).*

(Continued)

*Primary Examiner* — Magali P Slawski
(74) *Attorney, Agent, or Firm* — Harness Dickey & Pierce, PLC (57) ABSTRACT

An apparatus for the purpose of power generation by collecting or reflecting light using a foldable surface for compact transport, comprising of a circular surface divided into sectors, which in a closed folded position each sector is drawn closed by elevating a radius on one side of the sector on a pivot along the radius, and which in an opened position is held rigid by both radial and circumferential support.

15 Claims, 10 Drawing Sheets

(56) References Cited

U.S. PATENT DOCUMENTS

| | | | |
|---|---|---|---|
| 2004/0104861 A1* | 6/2004 | Schmid et al. | 343/915 |
| 2004/0134526 A1* | 7/2004 | Freedman | 135/20.3 |
| 2008/0092936 A1* | 4/2008 | Carabillo | 135/16 |
| 2009/0032101 A1* | 2/2009 | Kempe et al. | 136/259 |
| 2009/0283132 A1* | 11/2009 | Huang | 136/245 |
| 2013/0167911 A1* | 7/2013 | Ikenaga et al. | 136/251 |

OTHER PUBLICATIONS

Kaihara et al. ("Physical Basis of Flower-opening in Pharbitis nil" Plant & Cell Physiol. 22(2): 307-310 (1981)).*

Chambers 21st Century Dictionary (Face. (2001). In M. Robinson and G. Davidson (Eds.), Chambers 21st Century Dictionary. London, United Kingdom: Chambers Harrap. Retrieved from http://search.credoreference.com/content/entry/chambdict/face/0).*

* cited by examiner

FOLDABLE SOLAR POWER RECEIVER

CLAIM OF PRIORITY

This application is a Continuation-in-Part of U.S. patent application Ser. No. 13/491,110 entitled "Sun Tracking Foldable Solar Umbrellas for Electricity and Hot Water Generation" filed Sep. 29, 2011.

BACKGROUND OF INVENTION

Traditional solar power systems comprise of individual photovoltaic panels that are rigid, heavy, and immobile, covering large areas in a stationary manner that makes transportation of these systems impractical. To handle wind and rain, these exposed systems require heavy and strong protection, such as glass surfaces covering the panel, aluminum frames around the panels, and often steel structure for providing a canopy on which these solar system stands. Most of the cost of a residential solar power system consists of design, placement, rooftop reinforcement, and installation of solar panels. The present invention significantly reduces such cost, by allowing placement of the solar system on the ground as part of a shading canopy.

Solar thermal systems which concentrate sunlight onto a focal point also require the use of glass mirrors and steel structures to support the mirrors and the solar receiver at the focal point. The light concentrator can be a parabolic trough with a tubular heater along the foci of the trough, or a parabolic dish with a single focal point. For a parabolic dish tracking the sun, wind force on the dish can be substantial when the dish is tilted in the direction of the wind. Almost all solar thermal systems are utility scale generation.

SUMMARY OF INVENTION

The present invention allows much smaller and portable scale solar thermal generation suitable not only for household electricity generation, but also household solar water heating as well as solar absorption chilling.

The present invention is a solar power receiver that is light, foldable, and therefore portable. To safeguard against the elements, the solar panels can flex in the presence of light wind and fold during night or gale force wind for better protection and wind resistance. The minimized footprint, combined with the light weight of the panels or reflectors, allows wind force to be deflected, also making the system easy to be transported. The present invention focuses on small scale and portable solar power systems, generating power where it is used, instead of relying on large scale multi-megawatt generation that requires a grid for transmitting power to the user.

The present invention is aesthetic, mimicking the folding of a flower that opens fully to the sun. This beauty embodies functions such as maximized exposure to the sun, providing shade below, and employing a stalk for minimized footprint, as well as maximized structural support of the petals. Architectural breakthrough, focusing on multiple applications and functions, allows structures to be built with strength, integrity, and beauty.

The present invention advantageously provides a circular surface and methods of folding the surface that maximizes sun tracking area and minimizes the footprint of the folded structure. Much attention is paid to create symmetry. Improved lightweight panels and reflective surfaces are provided to facilitate portability without sacrificing integrity.

A flat circular surface can be used to place solar cells, made to track the sun such that the amount of light received is maximized with the normal of the surface aligned with the solar rays. To allow folding, the surface is subdivided and solar cells are contained entirely within each subdivided surface. The circular surface is divided into N sectors, with each sector bounded by two radii with angular separation of 360 degrees divided by N. The cells are placed with maximum coverage by the cells.

A parabolic dish can be used to reflect sunlight onto a focal point for either concentrated solar photovoltaic generation or concentrated solar thermal electricity generation. In terms of geometry, a flat circular surface is a limiting case of a parabolic dish with focal point at infinity.

In either case, the surface is divided into N equal sectors (each called a petal) bounded by two radii including an angle of 360 degrees divided by N for the sector. A radial member referred to as a spine is added to one (the center, the left or the right) radius. The spine hinges on a petal holder at a distance from the center of the surface. The hinge allows each petal to be lifted in elevation in the folded position through elevating a spar towards the center in a manner similar to that for an umbrella, albeit inverted when open.

In the open position, a support is used to bind the petals together in the circumference, such as by threading a ring rope through a hole on the underside for each petal, located close to the center of the petal. The ring rope is tight in the fully open position, binding the petals together to form an integral surface.

The assembly held together by the petal holder can be elevated around a hinge on one side of the petal holder, with the hinge connected to a base collar that can be made to adjust the azimuth position of the assembly. Together, the assembly can track the sun on two axes, in elevation and in azimuth.

The collar is mounted and allowed to rotate in the azimuth on a fixed pole. The pole is mounted on the ground or vehicle.

DETAILED DESCRIPTION

Some embodiments enclosed herein relate to solar power collection systems which are foldable, light weight, and therefore portable, requiring little installation cost or hardware. The folding mechanism allows for easy transportation as well as a small form factor while deployed or transported. The embodiments are designed for adaptive adjustment to weather conditions and to withstand wind, hail, or rain, not by employing strong and heavy support, but by closure and flexibility. The embodiments therefore employ new material for constructing panels, their support, and mechanisms for folding and tracking. The embodiments realize a novel architecture of a complete, small, and portable system that can provide other applications, such as shading, heating, cooling, and water purification beside electricity generation.

Figure 1:
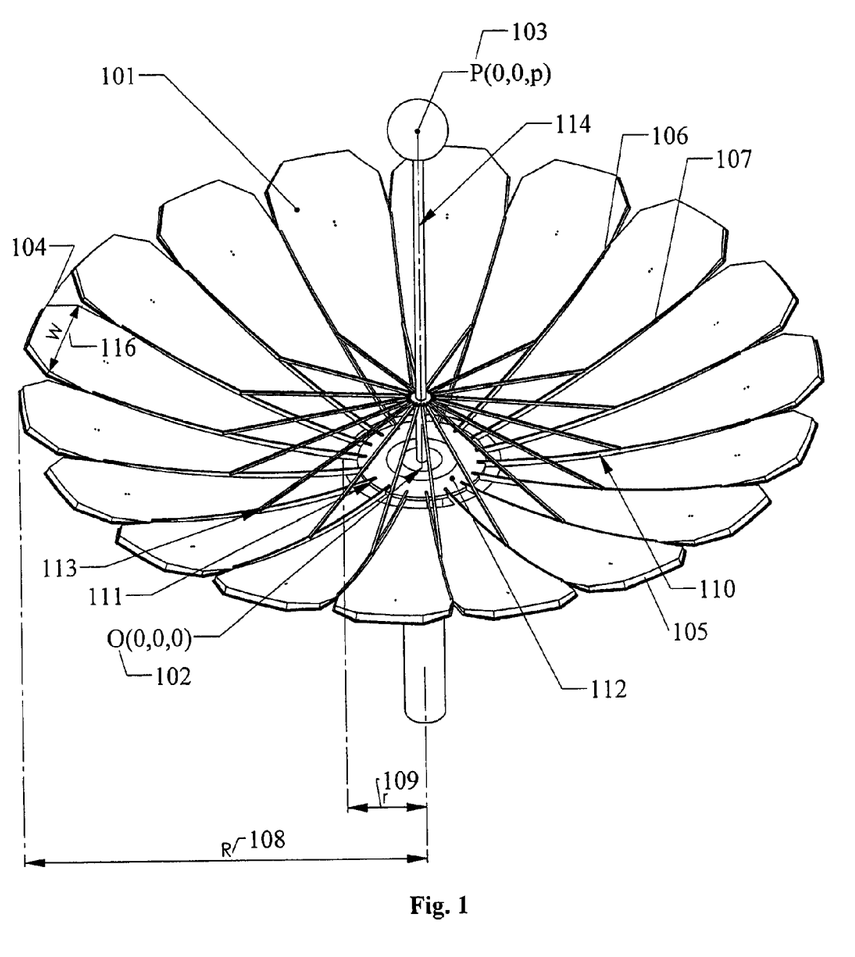
FIG. 1 shows the entire solar receiver in an open position for a parabolic dish
Figure 2:
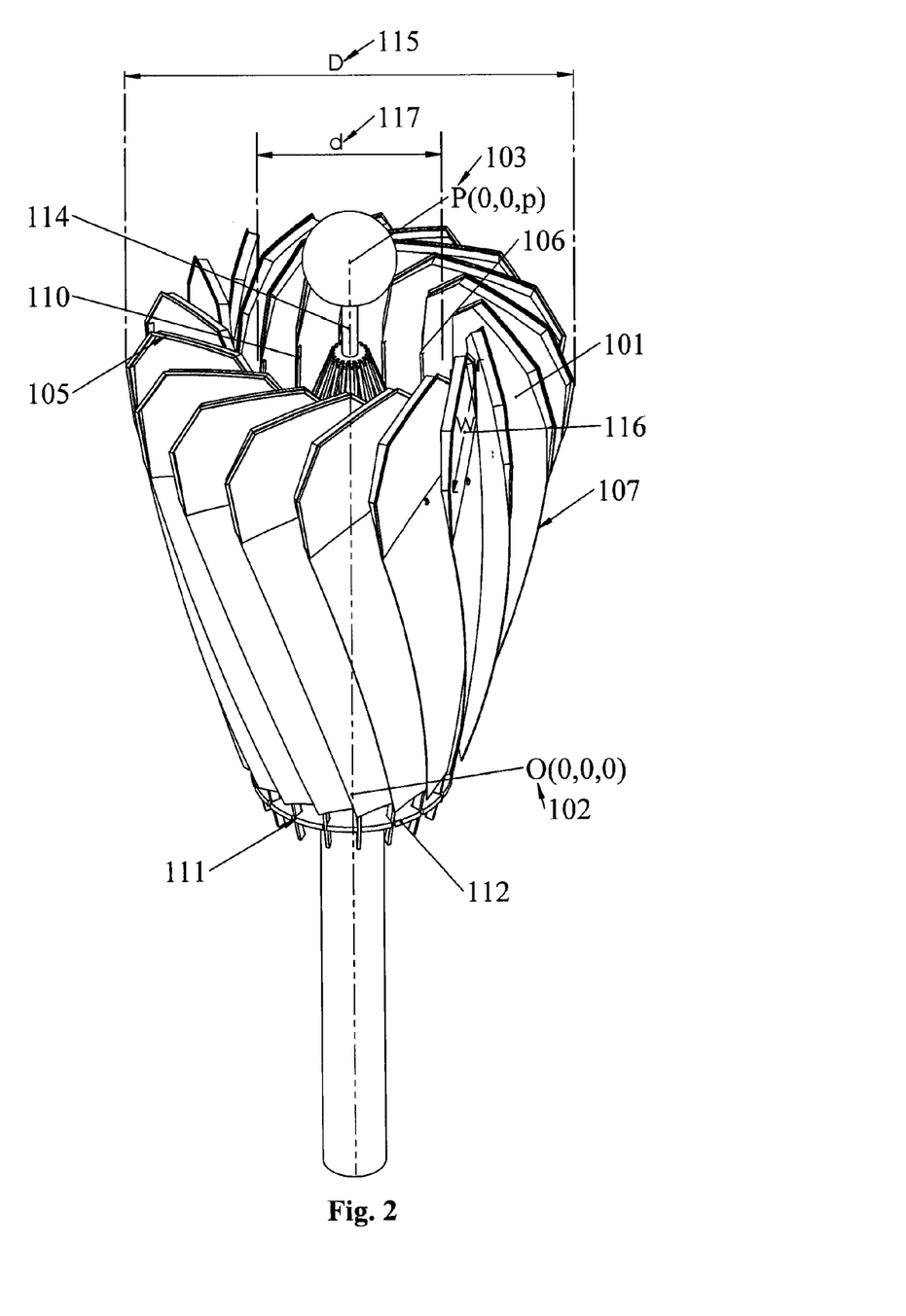
FIG. 2 shows the entire solar receiver in close position for a parabolic dish

One embodiment is shown in FIG. 1 and FIG. 2 which respectively show a sunlight reflecting parabolic dish in an open position and close position. The parabolic surface 101 has center O 102 at the Cartesian coordinate (x, y, z)=(0, 0, 0). The reflective surface 101 lies on the parabolic manifold defined by the equation $x^2+y^2=4pz$ in which p is the focal distance with the focal point P 103 at (0, 0, p), where in the figure a spherical solar receiver is shown. The receiver could be photovoltaic or solar thermal comprising a steam generator. The parabolic dish has reflective surface confined within the radius R, such that (x, y, z) on the parabolic surface on the boundary 104 satisfies the equation $x^2+y^2 \leq R^2$. For photovoltaic generation, the surface often is flat, which is a special case of a parabolic surface with focus at infinity.

A petal 105, which is a portion of the parabolic surface, is part of the parabolic surface broken into N sectors, with each sector called the i-th petal, $1 \leq i \leq N$. Each i-th petal is bound by two radii with equations $$y = \tan\left([i-1]\frac{2\pi}{N}\right)x \text{ and } y = \tan\left(i\frac{2\pi}{N}\right)x,$$

called respectively the right radius 106 and the left radius 107. Also, the petal is bounded by the outer circumference of radius R 108 and the inner circumference of radius r 109. In FIG. 1 and FIG. 2, N=18, but the choice of N can have a broad range.

A spine 110 for supporting and lifting the petal is added to the upper surface of a petal, on one side (shown in FIG. 2 on the left side). The upper surface is preferred as the depth of the spine may cause less collision with the adjacent petal in a folded position shown in FIG. 1. The spine is hinged at two positions, point A 111 which is the pivot point of elevating the petal vertically from the petal holder 112 and point B 113 which draws the petal upward and inward towards the center axis 114.

The petal holder 112 holds all petals in an open position when the petals are down and in an close position when the petals are drawn as close to the center as possible before the edges of the petal collide at the top. A key insight why this asymmetrical placement of the spine on one side provides compact folding is explained here. Seen from the top in FIG. 1, the outer circumference of radius R 108 (or inner circumference of radius r 109) is tangential to the left radius 107. The left radii of all petals radiate from the center O 102. Since the circumference 108 is tangential to its radius 107, the petals are pulled in without collision until the left radius goes past the vertical position.

As the petals fold, they form a vortex similar to the arms of a galaxy, compacting the folding as the petals are lifted. Since the petals are very thin, the petals do not collide at all until the petals converge at the center, forming a radiating pattern instead from the center axis 114. In this very tight form of folding, the largest diameter D 115 is about twice the width W 116 of each petal as shown in FIG. 2. Since the width of the petal is approximately the circumference divided by N, the largest folded diameter decreases with N. Judicious choice of N is therefore necessary to balance the complexity resulting from a larger N which allows a smaller folded diameter. The petals, when folded, form an inner diameter d 117 as shown in FIG. 2.

Figure 3:
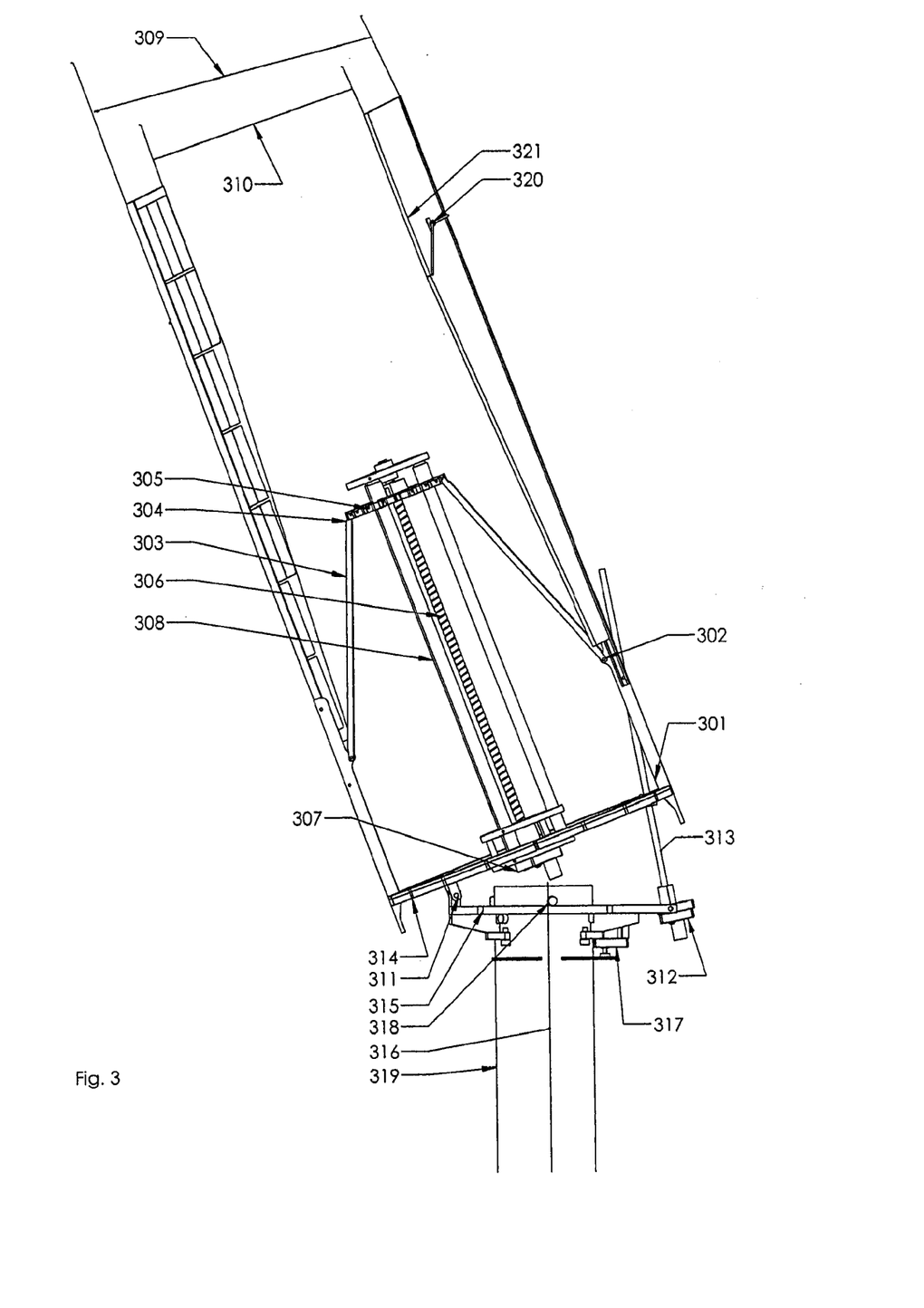
FIG. 3 shows the folding mechanism together with the sun tracking mechanism

The folding mechanics and solar tracking mechanics are shown in FIG. 3 with some, but not all, petals in place, and the petals contain photovoltaic cells instead of a reflective surface. The petals are held in place at three points: point A 301 where the petal is pivoted, point B 302 at one end of the spar 303 where the petal is lifted, and point C 304 where the other end of the spar is hinged on a spider ring 305. The spider ring is lifted by means of a lift screw 306 in order to close the petals around the center axis. A motor 307 turns the screw 306 for opening and closing, which can be triggered by conditions of light, wind, and time of use. The spider ring is also supported by three supporting rods 308 to prevent twisting and tilting of the spider ring.

In practice, the thickness of the petals and avoidance of colliding petals prevent a complete closure, leaving an inner diameter $D_i$ 309. The largest diameter D 310 is now larger than twice the width W of each petal, which is increased by an amount according to Pythagoras's Theorem $D = \sqrt{(2W)^2 + D_i^2}$. Accordingly, D increases slowly with a small $D_i$ and hence a complete closure of the petals around the center axis may not be necessary.

To track the sun for the purpose of maximized light collection, a two axes tracking mechanism is shown in FIG. 3. The first axis 311 controls the elevation or tilting of the collector surface. A motor 312 drives a screw 313 to lift the petal holder 314 according to the elevation of the sun in the sky. The petal holder is hinged to a base ring 315, which hinges onto the petal holder 314. The second axis 316 controls the azimuth (north-west-south-east) tracking of the sun. A motor 317 rotates the base ring 315 of the petal holder 314, with the base ring 315 placed between rollers 318 to allow the rotation of the base around a pole 319.

The elevation and azimuth position of the sun, for example, can be calculated given the latitude and longitude location of the solar collector, as well as the date and local time. An alternative method of tracking relies on light sensing, using a feedback mechanism to point the surface towards the sun. Both methods are well known in the art of sun tracking. Either one method or a combination of both methods can be devised for solar tracking. Alternative methods can also be implemented.

The pole 319 is mounted on the ground or other platforms such as rooftops or vehicles. The mounting may be calibrated such that the pole is vertical with marked and fixed direction.

The points A 301, B 302, and C 304 form a rigid triangle in the open or close position of each petal. The petal holder, together with the center axis, provides structural integrity of the parabolic surface in the radial direction. To provide lateral or circumferential integrity, the petals are bound by means of a threaded wire 321. In one realization of binding, a ring 320 is installed on the underside and center of each petal. A close ring wire 321 is threaded through the rings 320 of all petals. When the surface is fully open, the length of the ring wire is the same as the circumference formed by these rings. The tight wire then binds the petals together. This binding provides integrity of the parabolic surface, which is important for accurate focusing of sunlight as well as lateral strength of the surface in the presence of wind.

The ring 320 is placed to also provide tightness of the threaded ring wire 321 in a close position. In a close position, the petals are closer to each other than in the open position. However, the threaded ring wire 321 now takes a more circuitous path over outer edge before reaching the ring of another petal.

Other lateral support methods can be used. For the open position, adjacent petals can be attached through the use of hooks, or the use of attractive poles of magnets. The threaded ring wire approach is preferred, as the use of hooks or magnets requires a proper unlatching mechanism in the process of closing.

Figure 4:
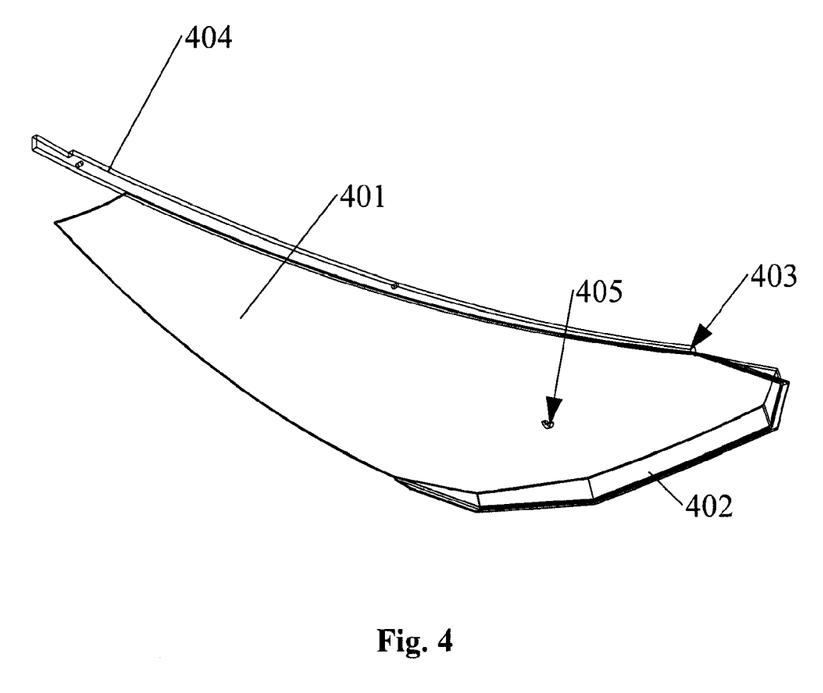
FIG. 4 shows the construction of an individual petal for reflecting light

The construction of a single reflective petal is shown in FIG. 4. One method of construction is to vacuum form the shape after softening a plastic material by means of heating. Vacuum forming shapes the parabolic shape 401, as well as creates crease lines 402 on the edge to make the shape more rigid. Additional support made of aluminum 403 could be added to provide extra strength, such as the spine 404 on the left for lifting purposes. A reflecting coating could be deposited or reflective surface could be applied on top of the plastic to reflect sunlight. The ring 405 on the underside of the petal provides lateral support by the threaded ring wire mentioned earlier.

An alternative method for building a reflective petal could be achieved by stamping a metallic reflector into a parabolic surface, with crease line 402 stamped in to provide extra strength. The reflector is mounted onto aluminum frames to prevent deformity of the reflector.

Figure 5:
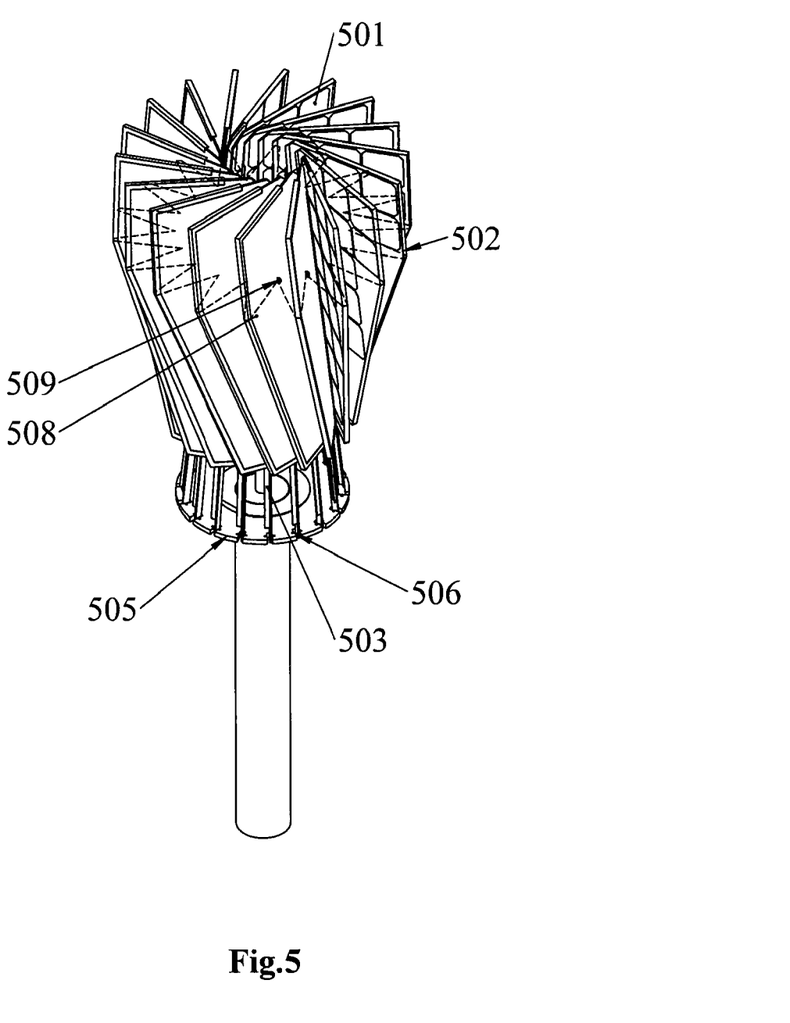
FIG. 5 shows the entire solar receiver in a close position for a flat photovoltaic surface
Figure 6:
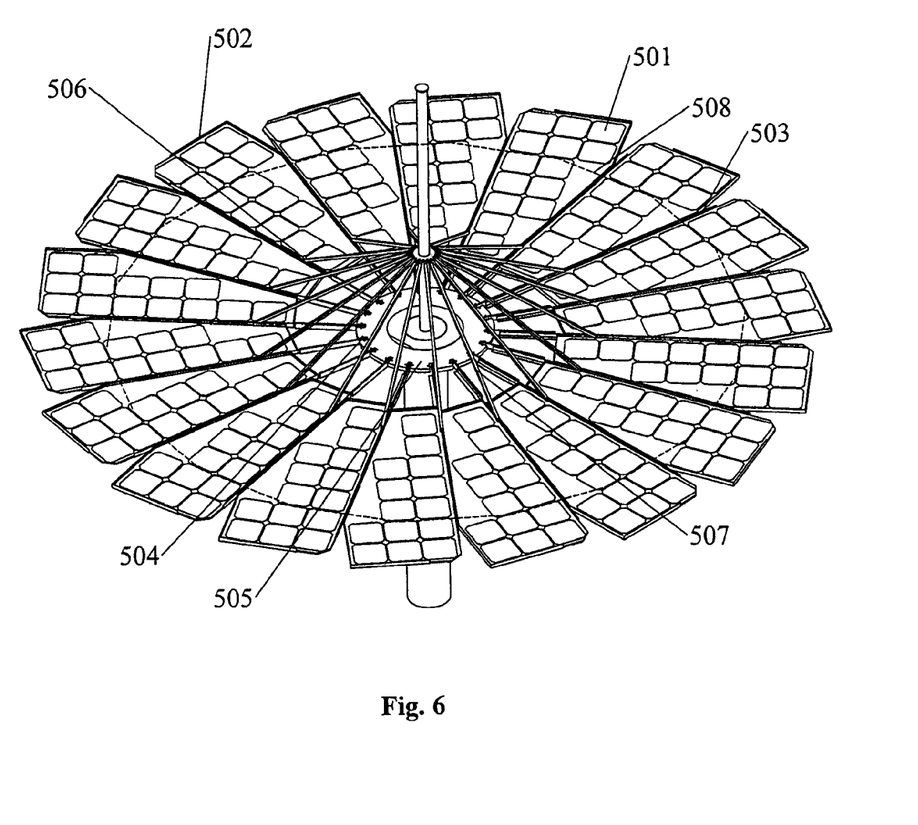
FIG. 6 shows the entire solar receiver in an open position for a flat photovoltaic surface

In one embodiment of the solar collector, photovoltaic cells 501 on the upper side of the folding surface produce electricity; instead of a reflective surface for concentrating sunlight. A flat panel 502 of cells comprises a petal. A flat surface is a special case of a parabolic surface with focal point at infinity. FIG. 5 and FIG. 6 show respectively the open and close positions. The petal holder 505 anchors the petals at point A 506. The lifting spine 503 is lifted at point B 506 by the spar 507. The basic principles of folding and tracking described earlier for parabolic mirrors apply similarly. The threaded ring wire 508 shown in dotted line (as it is on the underside of the panels) provides lateral support of the petals in the open position of FIG. 5. For the close position of FIG. 6, the threaded ring wire 508 takes a circuitous path to connect adjacent rings 509. The ring wire 508 remains tight in both the open and close position, but may be less tight in the half open position.

Figure 7:
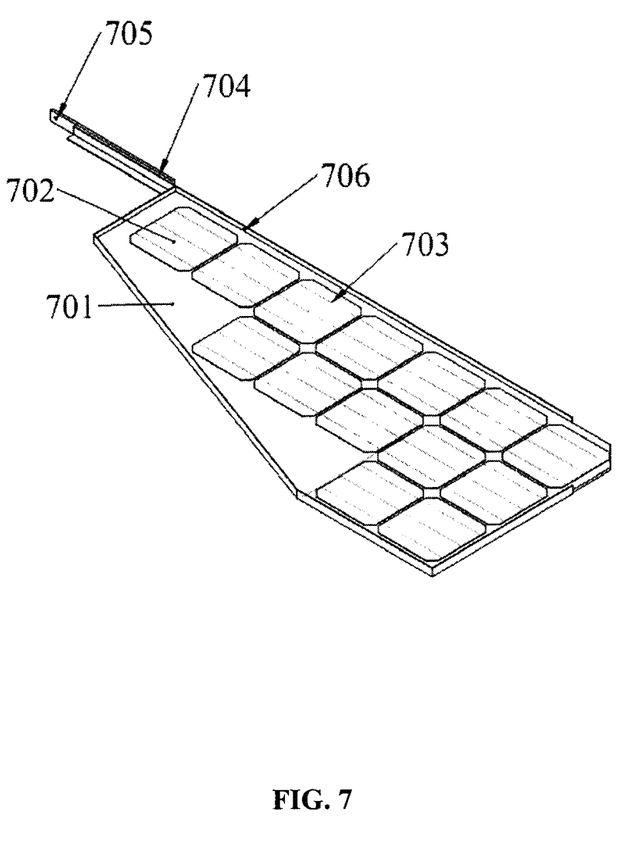
FIG. 7 shows the construction of an individual petal with 14 cells placement
Figure 8:
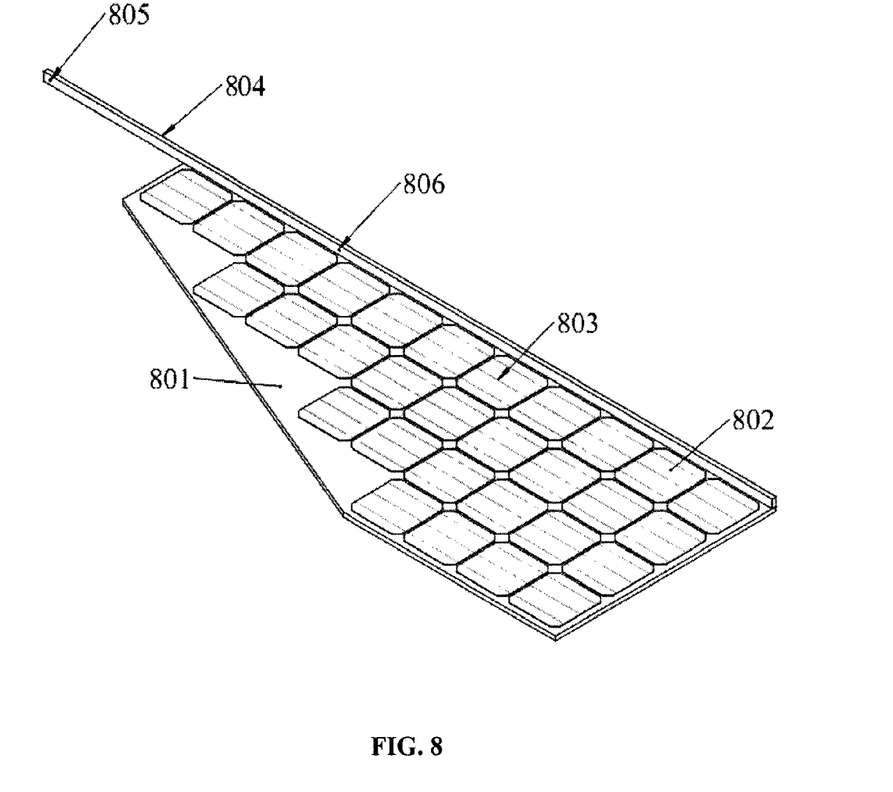
FIG. 8 shows the construction of an individual petal with 30 cells placement

For photovoltaic collection, solar cells of a square shape are placed on sectors. Some surface of a sector may not be covered by these square cells, and certain inefficiency occurs. Some of these areas could be cut out from the sector, for example near the outer circumference of the sector. FIG. 7 and FIG. 8 show the placement of cells with small amount of uncovered surface. FIG. 7 shows a configuration whereby a panel 701 comprises 14 cells 702 arranged in three columns of 7 cells, 5 cells, and 2 cells. FIG. 8 expands the 14 cell configuration by placing an additional 4 rows each of 4 cells, adding 16 cells 802 to produce a 30 cell panel 801. There are four columns of 11 cells, 9 cells, 6 cells, and 4 cells. These two designs allow simple tabbing and routing of current collecting ribbons 703 803 from cell to cell: current is collected up the column on the left, then down the next column to the right, and up the next column, etc. The spines 704 804 are hinged to the petal holder at point A 705 805. The lifting spar is hinged to the petal at point B 706 806.

An important aspect of this invention, beyond the specialized shape and folding of the solar panels, is the light weight and strength of these panels, requiring a novel method to construct solar panels beyond the use of glass and aluminum frame. In one embodiment shown in FIG. 9, the solar panel comprises the following layers. On the top, Teflon 901 film is employed in lieu of glass. For adhesion and weathering of the cell, an encapsulant polymer such as EVA is employed on top 902 and beneath 903 the solar cell 904. The polymer adheres to Teflon and a bottom support. For strength, lightness, and flexibility, the bottom support can be a plastic composite 905, typically made of a plastic or polymer foam 906 laminated on top 907 and bottom 908 by fiber cloth with polymer or epoxy adhesive 907. A spine 909, made either of plastic/polymer composite or aluminum channels or both, is added for lifting and support.

Figure 9:
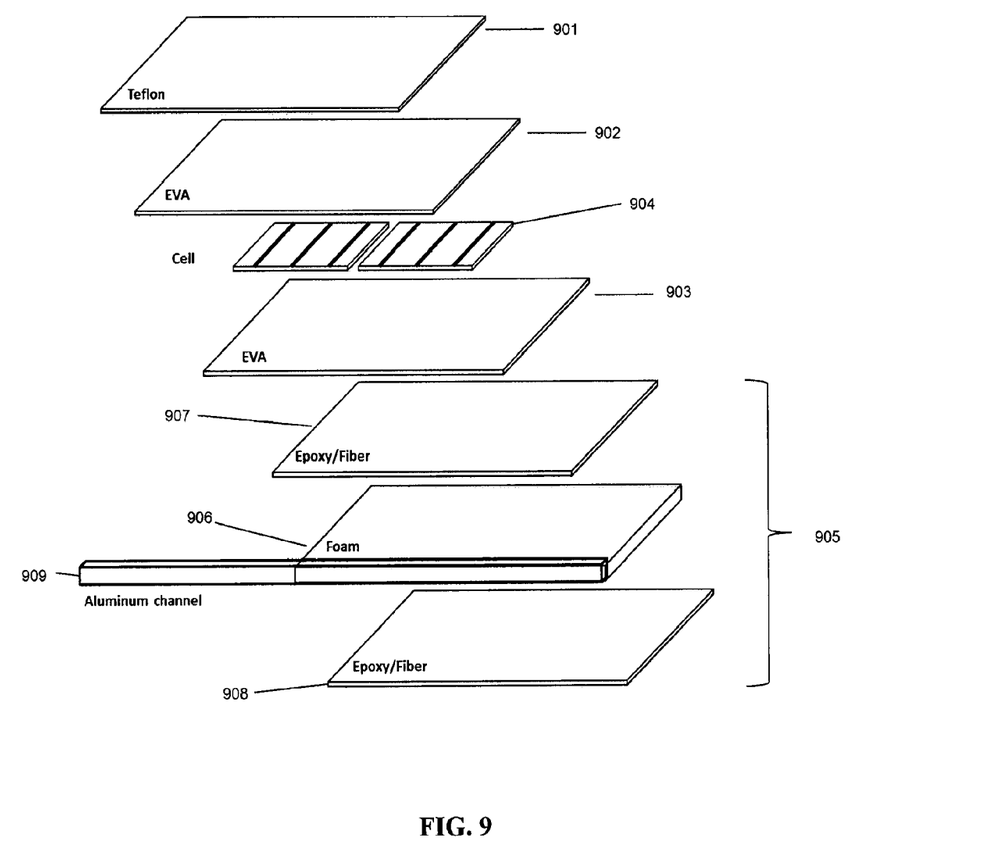
FIG. 9 shows one method to construct strong and light solar photovoltaic panels
Figure 10:
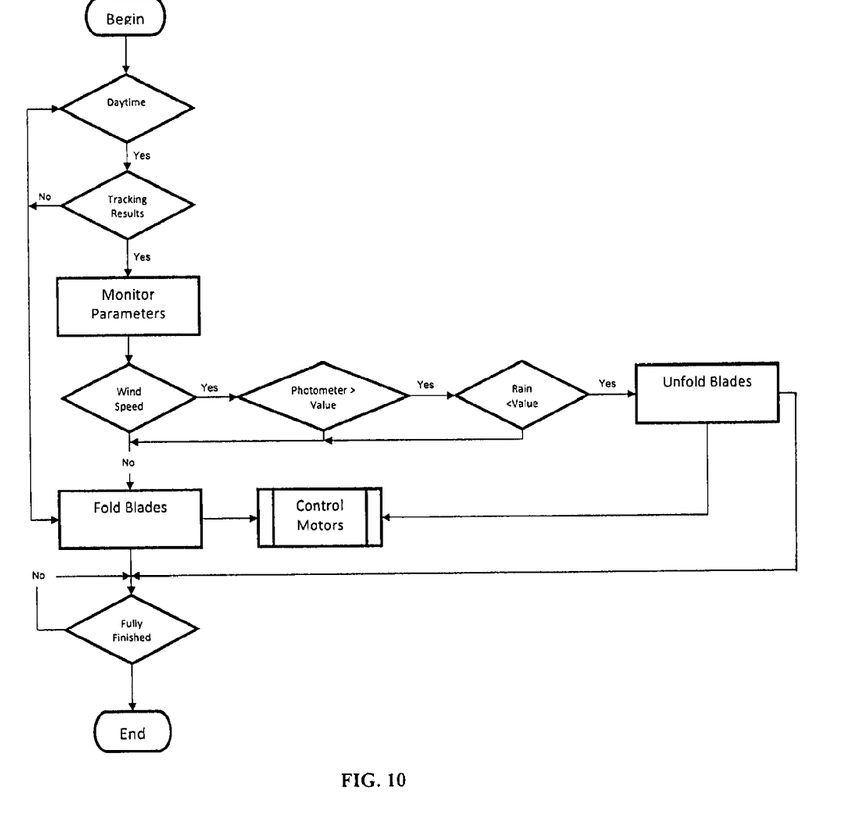
FIG. 10 shows control methods for sensing wind, rain, and light conditions for closure

Control means are added as shown in FIG. 9 such that conditions of wind, rain, and light conditions are added for the purposes of opening and closure, as well as sun tracking. Thresholds are set for closure for high wind speed and extended period of low light. Beyond closure, very strong wind may require tilting the closed collector. In the presence of hurricane wind force, the petals may be removed or sheltered. Given the portable nature, the entire assembly can be moved into a shelter.

Though the invention has been described with respect to a specific preferred embodiment, many variations and modifications will become apparent to those skilled in the art upon reading the present application. The intention is therefore that the appended claims be interpreted as broadly as possible in view of the prior art to include all such variations and modifications.

The invention claimed is:

1. A foldable solar collector, comprising:
   an elongated central member;
   a plurality of rigid petal members each coupled at a first end to the central member and radially extending away from the central member to a second end, the plurality of petal members each having a bottom surface and an opposing upper surface comprising a photovoltaic converter, the plurality of petal members configurable in a closed position proximate the central member, and configurable in an open position when extended away from the central member such that the petal member upper surfaces collectively form a solar collection surface; and
   a plurality of leverage members each having a first portion coupled to one of the plurality of petal members and a second portion coupled to the central member, the plurality of leverage members configured to retract the plurality of petal members to the closed position such that the plurality of petal members overlap one another and the upper surfaces including the photovoltaic converters of each of the plurality of petal members are closer to the central member than are the opposing bottom surfaces, wherein the plurality of petal members collectively form a vortex when overlapped in the closed position such that at least a portion of the petal upper surfaces are directed towards a space defined between the plurality of petal members and the central member and at least a portion of the bottom surfaces are directed away from the space,
   wherein each of the petal members has opposing radial edges radially extending away from the central member, wherein each one of the leverage members is rigid and directly coupled to one said radial edge of one said petal member.

2. The foldable solar collector as specified in claim 1 wherein the plurality of leverage members comprise a plurality of rigid radial members, each said radial member asymmetrically coupled at a first end to the upper surface of one said petal member and to the central member at an opposing second end, the plurality of radial members configured to retract the plurality of petal members to the closed position such that the plurality of petal members overlap one another and also face the central member.

3. The foldable solar collector as specified in claim 2 wherein each of the petal members is configured as a paddle, each of the petal members having a spline member directly coupled to the upper surface of one of the petal member radial edges and reinforcing the petal member.

4. The foldable solar collector as specified in claim 1 wherein each of the leverage members is directly coupled to a midsection of the respective petal member radial edge between the respective petal member first and second end.

5. The foldable solar collector as specified in claim 4 wherein each of the leverage members is rotatably coupled to the central member and directly rotatably coupled to the respective petal member radial edge.

6. The foldable solar collector as specified in claim 1 further comprising a reinforcing member circumferentially extending about the plurality of petal members and configured to provide lateral support of the petal members to one another in the open position.

7. The foldable solar collector as specified in claim 6 wherein the reinforcing member comprises a cable.

8. The foldable solar collector as specified in claim 7 wherein the cable is threaded through each of the petal members.

9. The foldable solar collector as specified in claim 1 wherein the central member comprises a ring, wherein the first end of each of the petal members is rotatably coupled to the ring.

10. The foldable solar collector as specified in claim 1 further comprising a retractor coupled to the rigid leverage members and configured to extend the plurality of petal members to the open position, and retract the plurality of petal members to the closed position.

11. The foldable solar collector as specified in claim 1 further comprising a positioning member configured to selectively establish an elevation and azimuth of the solar collector.

12. The foldable solar collector as specified in claim 1 wherein each said petal member comprises a plastic layer or a polymer foam layer laminated between a fiber cloth and at least one photovoltaic converter.

13. The foldable solar collector as specified in claim 12 further comprising a encapsulant layer disposed over the photovoltaic converter.

14. The foldable solar collector as specified in claim 1 wherein the solar collection surface is flat.

15. The foldable solar collector as specified in claim 1 wherein each of the leverage member second portions are configured to longitudinally move along a length of the central member.

* * * * *